(12) United States Patent
Kornrumpf et al.

(10) Patent No.: US 6,987,619 B2
(45) Date of Patent: Jan. 17, 2006

(54) LENS ARRAY PACKAGE AND FABRICATION METHOD

(75) Inventors: William Paul Kornrumpf, Schenectady, NY (US); Samhita Dasgupta, Niskauna, NY (US); Brian Scott Leininger, Woodbury, MN (US); Charles John Kryzak, Mendota Heights, MN (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/815,908

(22) Filed: Mar. 31, 2004

(65) Prior Publication Data

US 2005/0225864 A1  Oct. 13, 2005

(51) Int. Cl.
*G02B 27/10* (2006.01)
*G02B 6/36* (2006.01)
*G02B 6/32* (2006.01)
*G01D 5/34* (2006.01)

(52) U.S. Cl. ............ 359/619; 359/621; 359/622; 257/433; 250/216; 250/231.13; 385/88; 385/89; 385/33; 385/137; 438/106; 438/151

(58) Field of Classification Search ........... 359/619, 359/621, 622, 642, 811; 385/33, 34, 88, 385/89, 97, 136, 137; 250/216, 231.13; 257/98, 257/432, 434, 680, 684, 433; 438/106, 151, 438/156; 348/335
See application file for complete search history.

(56) References Cited

U.S. PATENT DOCUMENTS

| | | | |
|---|---|---|---|
| 5,130,531 A | | 7/1992 | Ito et al. ............ 250/216 |
| 5,296,724 A | | 3/1994 | Ogata et al. .......... 257/98 |
| 6,122,009 A | * | 9/2000 | Ueda .................. 348/335 |
| 6,322,257 B1 | | 11/2001 | Kryzak ................ 385/88 |
| 6,373,635 B1 | * | 4/2002 | Fujimoto et al. ...... 359/619 |
| 6,646,807 B2 | * | 11/2003 | Yoshikawa et al. ..... 359/619 |
| 6,703,601 B2 | * | 3/2004 | Taniguchi et al. ..... 250/231.13 |
| 6,707,613 B2 | * | 3/2004 | Fujimoto et al. ...... 359/622 |
| 6,717,733 B2 | * | 4/2004 | Sato et al. .......... 359/619 |
| 6,766,076 B2 | * | 7/2004 | Hikichi et al. ....... 385/33 |
| 6,847,491 B1 | * | 1/2005 | Jian et al. .......... 359/642 |
| 2004/0190851 A1 | * | 9/2004 | Garner et al. ........ 385/137 |

* cited by examiner

*Primary Examiner*—Loha Ben
(74) *Attorney, Agent, or Firm*—Ann M. Agosti; Patrick K. Patnode

(57) ABSTRACT

An optical lens structure includes a substantially transparent substrate a lens array attached to the substrate with lenses of the lens array situated opposite the substrate and packaging material surrounding at least the periphery of the lens array, the packaging material including at least two alignment holes which are aligned with respect to positions of the lenses. In one example, the structure is fabricated by attaching a lens array to a substrate with lenses of the lens array situated opposite the substrate, surrounding a periphery of the lens array with a packaging material, the packaging material being attached to the substrate, planarizing the packaging material, and providing alignment holes through the packaging material.

30 Claims, 5 Drawing Sheets

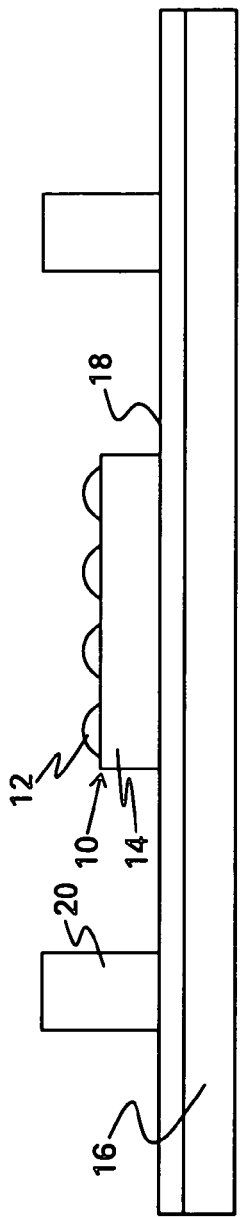
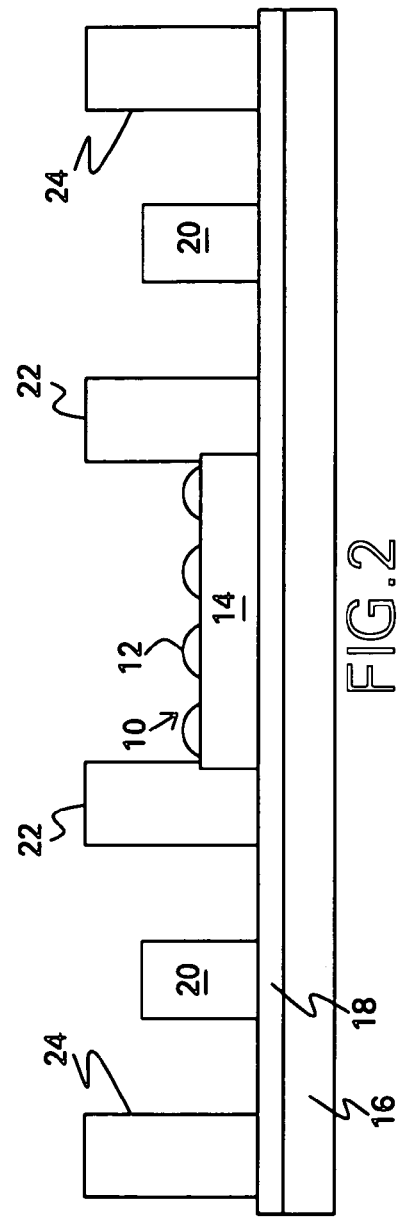
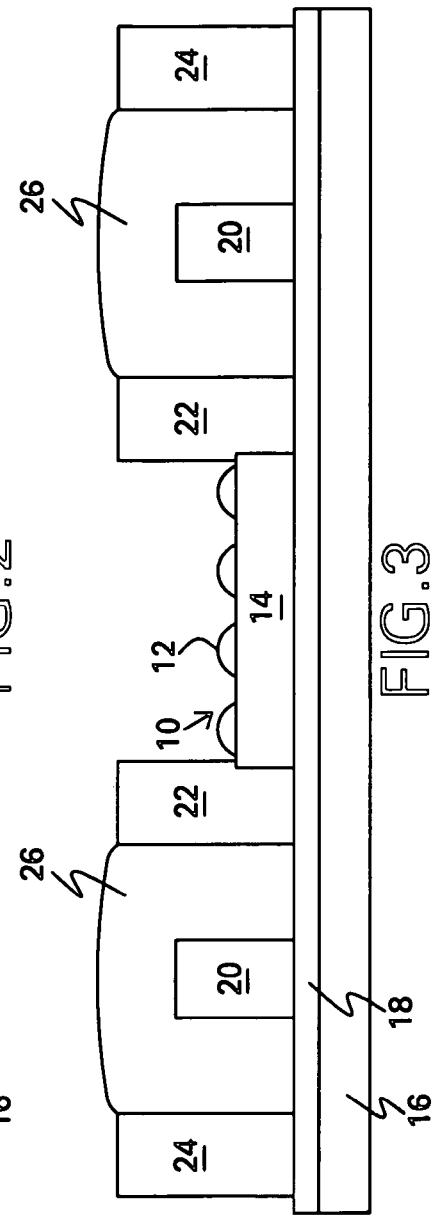

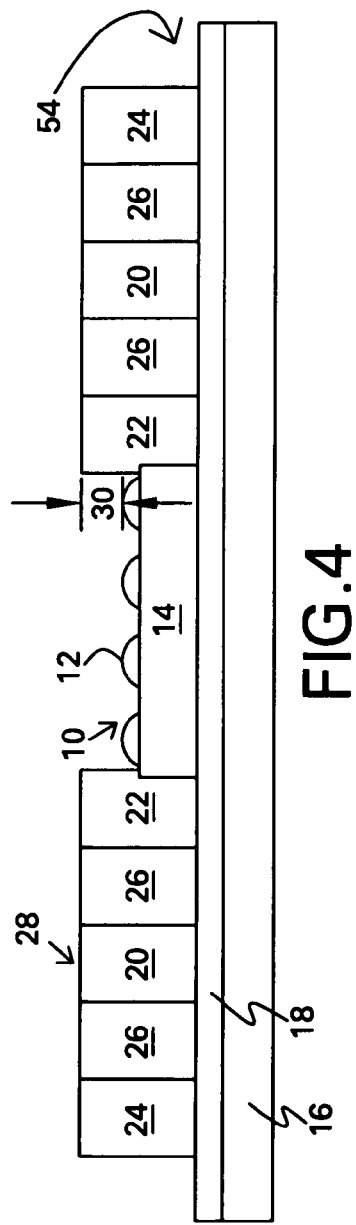
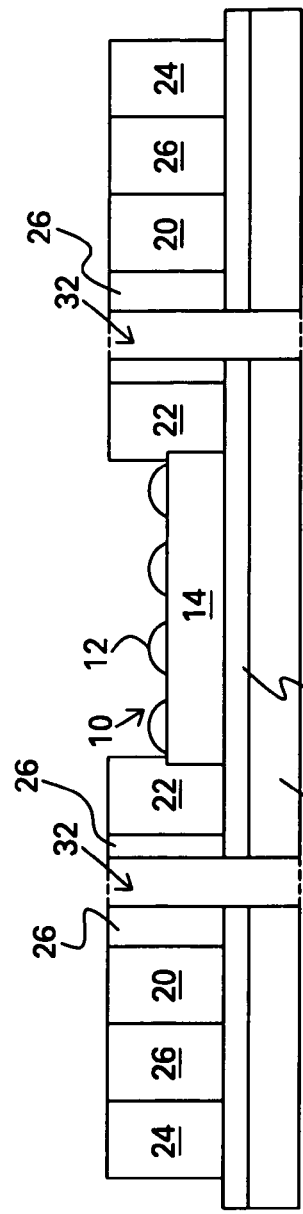
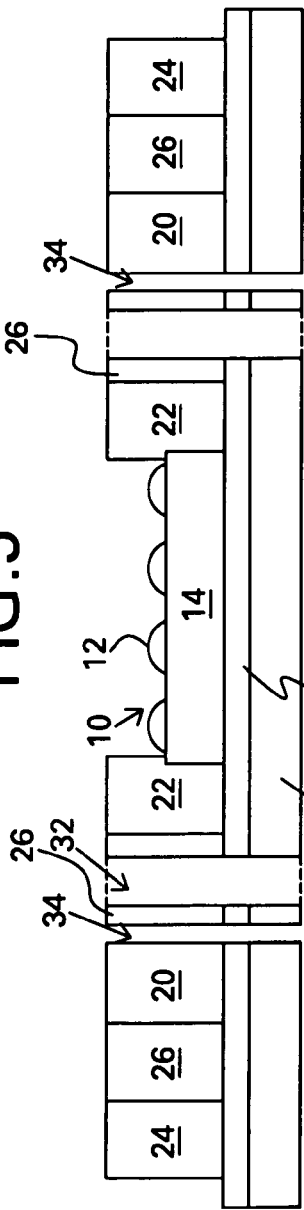

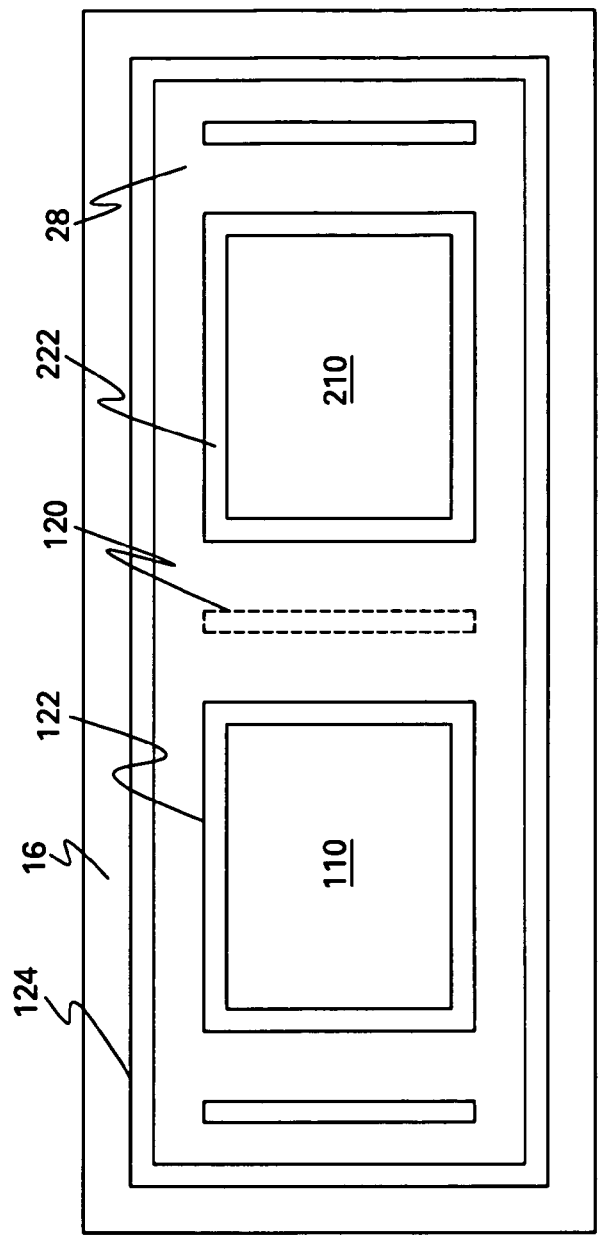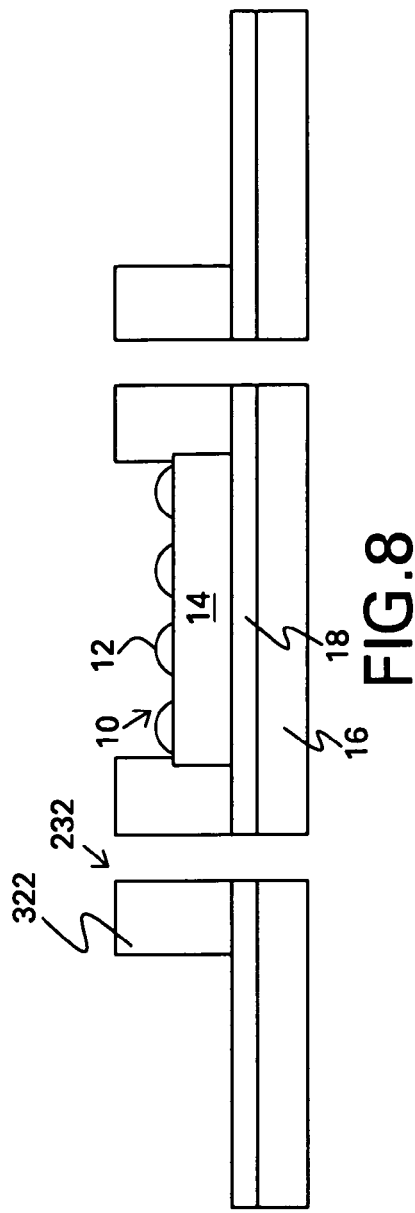

LENS ARRAY PACKAGE AND FABRICATION METHOD

BACKGROUND

The invention relates generally to lens array packaging.

Many optoelectronic applications require lens arrays to either collimate or focus optical beams. Such systems typically include about four to forty eight optical paths. Alignment of all of the optical paths is typically needed between the lens array and one or more of a fiber array, a detector array, and an emitter array. Conventional alignment techniques for lenses and fibers use manual and automated active alignment processes wherein an optical path is illuminated and a detector is used to monitor the optical path during the alignment process. Active alignment processes are time consuming and hinder efforts to bring down the expense associated multi-path optoelectronic modules.

It would therefore be desirable to provide a lens array package without using a labor intensive alignment process.

BRIEF DESCRIPTION

Briefly, in accordance with one embodiment of the present invention, a method comprises attaching a lens array to a package substrate with lenses of the lens array situated opposite the package substrate, surrounding a periphery of the lens array with a packaging material, the packaging material being attached to the package substrate, planarizing the packaging material, the planarized packaging material having a height higher than a height of the lens array, and providing alignment holes through the packaging material, the alignment holes being aligned with respect to positions of the lenses.

In accordance with another embodiment of the present invention, a structure comprises a substantially transparent package substrate, a lens array attached to the package substrate with lenses of the lens array situated opposite the package substrate, and packaging material surrounding at least the periphery of the lens array, the packaging material including at least two alignment holes which are aligned with respect to positions of the lenses and having a height higher than a height of the lens array.

DRAWINGS

These and other features, aspects, and advantages of the present invention will become better understood when the following detailed description is read with reference to the accompanying drawings in which like characters represent like parts throughout the drawings, wherein:

FIGS. 1–6 are sectional side view of stages in a lens package fabrication process in accordance with one embodiment of the present invention.

FIG. 7 is a top view of a stage in a lens package fabrication process in accordance with another embodiment of the present invention.

FIG. 8 is a sectional side view of a stage in a lens package fabrication process in accordance with another embodiment of the present invention.

DETAILED DESCRIPTION

Figure 9:
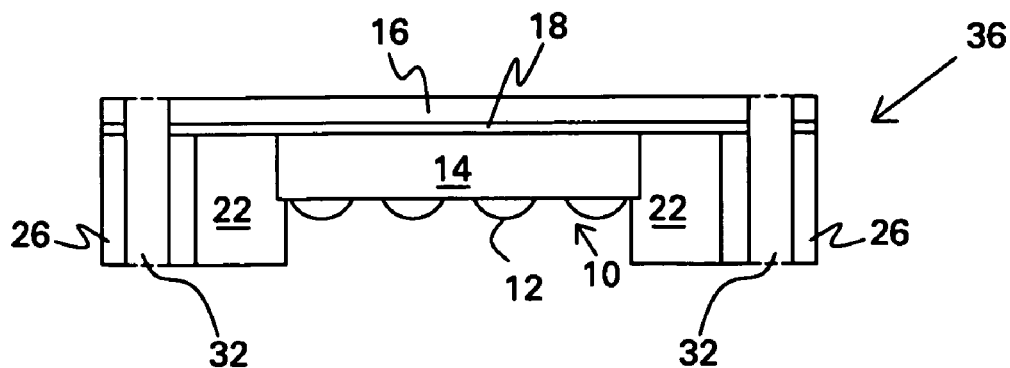
FIG. 9 is a sectional side view of a lens package fabricated by the embodiment of FIGS. 1–6.

FIGS. 1–6 are sectional side view of stages in a lens package fabrication process in accordance with one embodiment of the present invention wherein a method comprises attaching a lens array 10 (meaning at least one lens array) to a package substrate 16 with lenses 12 of lens array 10 situated opposite package substrate 16 (FIG. 1); surrounding a periphery of lens array 10 with a packaging material 54 (FIGS. 4–6), packaging material 54 being attached to package substrate 16 (FIGS. 2–4); planarizing packaging material 54 (FIG. 4), the planarized packaging material 54 having a height higher than a height of the lens array; and providing alignment holes 32 through packaging material 54 (FIG. 5), the alignment holes being aligned with respect to positions of the lenses.

Lens array 10 typically comprises a lens array substrate 14 comprising a substantially transparent material such as glass, and lenses 12 comprising microlenses with one example diameter being 250 micrometers. As used herein "substantially transparent" means absorbing less than about thirty percent of the incident light.

Package substrate 16 typically comprises any structurally suitable substantially transparent material. In one embodiment, package substrate 16 comprises a polymer, and in a more specific embodiment, the polymer comprises a polyimide, a polyetherimide, or a liquid crystal polymer. In such embodiments, wherein package substrate 16 is flexible (as opposed to a rigid material such as glass), it is particularly useful to additionally attach packaging material 54 to lens array 10 (as shown in the example FIGS. 2–6) by at least touching enough of the periphery in order secure lens array 10 in position with respect to substrate 16.

Optional adhesive 18 is useful for attaching lens array 10 and package substrate 16. Adhesive 18 may comprise any substantially transparent conventional die attach adhesive and in one example comprises epoxy based photo-patternable dielectric material designed for spin coating thin films available from Shipley Electronics under the name XP9500, for example.

Planarizing is typically accomplished using mechanical milling or lapping, for example. In FIG. 4, element 30 is used to show the distance between the top of lens 12 and planarized surface 28. In one embodiment distance 30 is about 600 micrometers. Planarizing can be facilitated by use of stop blocks 20. In one embodiment, stop blocks 20 comprise aluminum oxide ($Al_2O_3$) and have heights of about 1 millimeter. "Planarizing," as used herein, does not mean that the surface need be perfectly planar. Surface 28 is generally parallel to package substrate with less than about 10 micrometers of total run out across the lens array.

Typically two alignment holes 32 are provided for each lens array 10. However, additional alignment holes 32 can be added if desired. Positions of alignment holes 32 can be selected using features on lens array 10 for accurate positioning of alignment holes 32 with respect to lenses 12. Alignment holes 32 provide for the mechanical alignment of lens array 10 with either a conventional MT optical connector or an optical module provided with similar alignment holes.

In one embodiment, alignment holes 32 are fabricated using drilling. One example of a useful laser for drilling is an ultraviolet laser such as model 5200 from Electro Scientific Industries. Advantageously, the two holes can be drilled to coincide with the interface of the optical module to be attached. For MT connectors, the spacing between pins is 4.6 millimeters, for example.

Although the embodiment of FIGS. 1–6 illustrates a single lens array, large numbers of lens arrays can be packaged simultaneously. For each lens array, one side of the lens array is protected by substrate 16 and the other side is protected by being recessed into the back of the resulting lens package 36. The spacing from the back of the lens is set by the planarization step thereby simplifying the optical assembly.

In the embodiment illustrated in FIGS. 1–6, packaging material 54 comprises a first dam 22 around the periphery of the lens array, a second dam 24 around first dam 22, and filler material 26 between the first and second dams. In embodiments wherein adhesive 18 is used, it is useful to cure adhesive 18 prior to forming any dams. After the dam and fill operations, first and second dams 22 and 24 and filler material 26 are typically cured in a temperature controlled chamber (prior to planarizing). Stop blocks 20 may optionally be used in this embodiment as well. If stop blocks 20 are used, the heights of first and second dams 22 and 24 and filler material 26 are greater than the height of stop blocks 20. In any embodiment, an advantage of stop blocks is that stop blocks provide a simple mechanism for controlling the height of packaging material 54 during planarization.

Material of first and second dams 22 and 24 typically comprises a polymer but may comprise any material that can be applied in a manner to bead in the desired pattern for creating a dam. In a more specific embodiment, the dams comprise thixotropic material. In one process for forming first and second dams 22 and 24, an adhesive dispense machine (not shown) is used to "draw" the dams. More specific examples of useful dams and filler materials include epoxy resins with fillers to affect flow, shrinkage, and coefficient of thermal expansion. Several even more specific epoxy examples are Loctite HYSOL FP4451-TD for dams and Loctite HYSOL FP4651 for filler material, both available from Henkel Technologies.

Although second dam 24 is shown in proximity to first dam 22 in FIGS. 2–6 for purposes of illustration, second dam need not be in any specific location. For example, FIG. 7 is a top view of a stage in a lens package fabrication process in accordance with another embodiment of the present invention wherein second dam 124 is situated toward the outer edge of substrate 16. The embodiment of FIG. 7 is useful because one second dam 124 can be used in combination with multiple lens arrays 110 and 210 and multiple first dams 122 and 222.

FIG. 8 is a sectional side view of a stage in a lens package fabrication process in accordance with another embodiment of the present invention wherein packaging material 54 comprises a dam 322. In embodiments wherein a single dam is used without filler material, dam 322 needs sufficient dimensions to provide space for alignment holes 232.

FIG. 9 is a sectional side view of a lens package 36 fabricated by the embodiment of FIGS. 1–6 after the package substrate has been cut to form lens package 36 (along singulation cuts 34 of FIG. 6, for example) comprising lens array 10, a remaining portion of packaging material 54 (element 54 shown in FIG. 4), and alignment holes 32.

Figure 10:
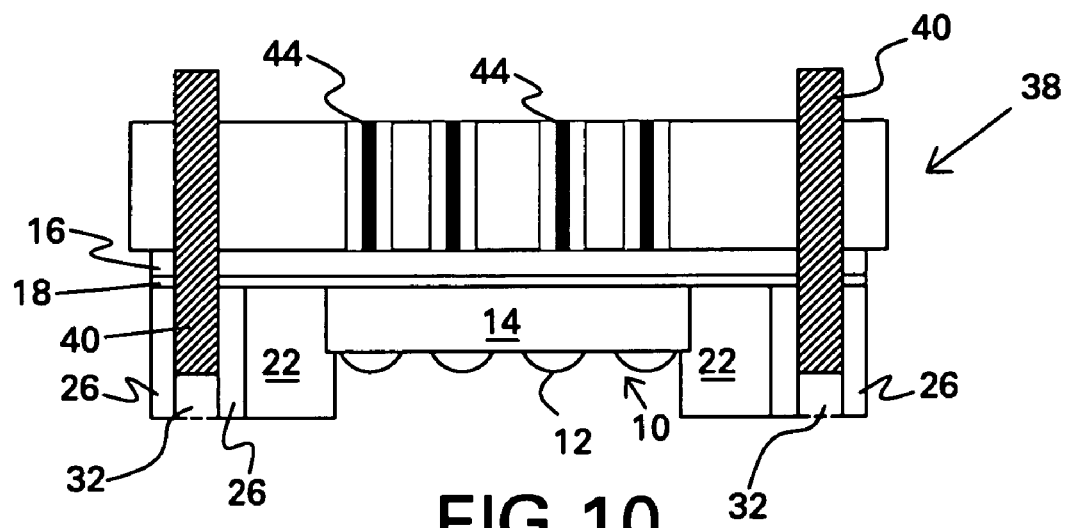
FIG. 10 is a sectional side view of the lens package of FIG. 9 coupled with an optical module comprising a fiber module.

FIG. 10 is a sectional side view of the lens package of FIG. 9 coupled with an optical module comprising a fiber 44 module 38. In one embodiment, lens package 10 and optical module 38 are mechanically coupled by inserting pins 40 through the alignment holes. Pins 40 may be attached to one of lens package 10 and optical module 38 either prior to or after positioning the lens package adjacent the optical module.

Figure 11:
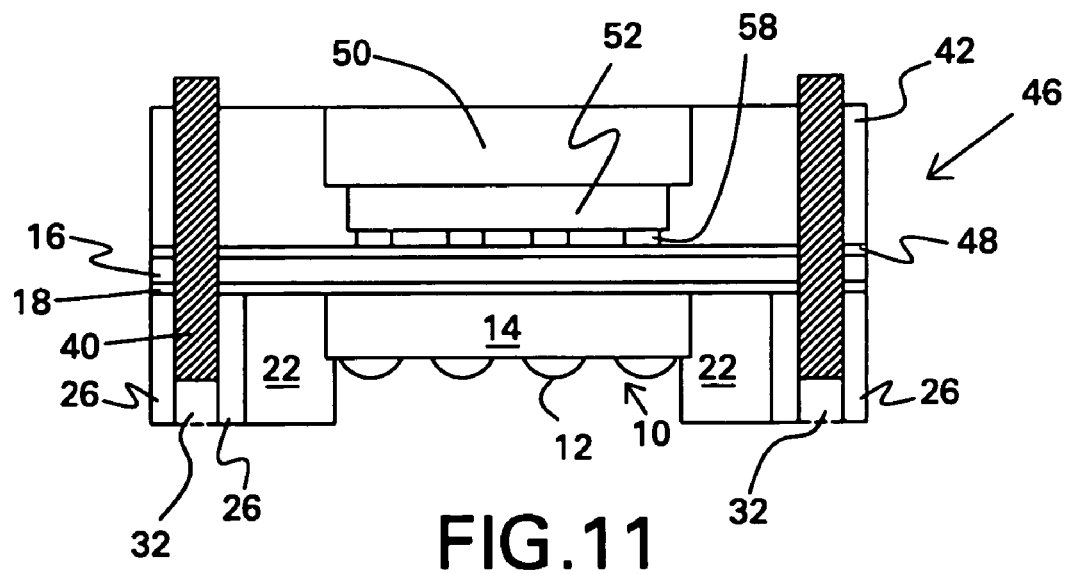
FIG. 11 is a sectional side view of the lens package of FIG. 9 coupled with an optical module comprising a photonic module.

FIG. 11 is a sectional side view of the lens package of FIG. 9 coupled with an optical module comprising a photonic module 46. In one embodiment, photonic module 46 is similar to the module described in Kryzak et al., U.S. Pat. No. 6,322,257 which describes incorporation of an interconnect layer 48 comprising multiple dielectric and electrical interconnection layers (not shown) with the electrical interconnection layers not overlying optically active portions of the module. As shown in FIG. 11, typical elements of a photonic module are photonic die 52 and a heat spreader 50 encased in a module substrate 42. Photonic die 52 typically includes photonic die elements 58 which may comprise emitters (such as vertical cavity surface emitting laser) or detectors (such as photodiodes), for example.

Figure 12:
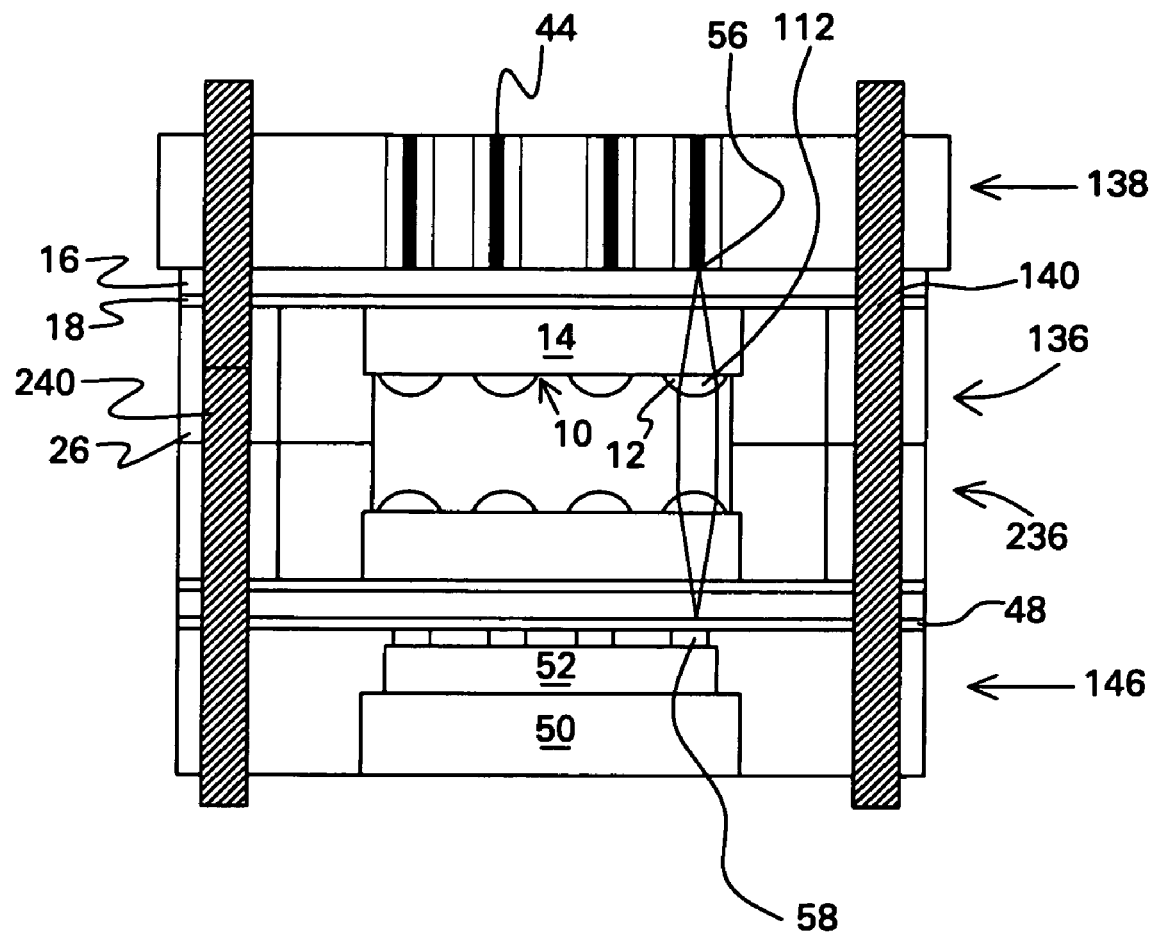
FIG. 12 is a sectional side view of the assembly of FIG. 10 coupled to the assembly of FIG. 11.

FIG. 12 is a sectional side view of the assembly of FIG. 10 coupled to the assembly of FIG. 11. More specifically, in this embodiment, lens package 36 comprises a first lens package 136 and optical module 38 comprises a first optical module 138 and first lens package 136, a second lens package 236, first optical module 138, and a second optical module 146 are mechanically coupled by pins 140 (illustrating one pin through each of the modules and packages or 240 (illustrating separate pins for separate modules). Although not shown, embodiments wherein the first and second modules both comprise fiber or photonic modules are also within the scope of the present invention.

Any of the optical modules in FIGS. 10–12 may comprise optical elements selected from the group consisting of, optical fibers, photo emitters, and photo detectors, and combinations thereof with at least some of the optical elements being aligned with respective lenses. In one more specific embodiment, at least one of the optical elements is situated at a distance of approximately one focal length from a respective lens (more specifically, from the edge of the lens facing away from package substrate 16). When working with small lenses, it can be difficult to accurately identify a precise focal point 56 or 58 (FIG. 12). As used herein, "approximately one focal length" means within about twenty percent of the distance where a collimated input beam width is minimized.

Using the above described embodiments, conventional microlens arrays can be aligned to conventional MT optical connectors and optical microelectromechanical systems (OMEMS) using semiconductor packaging materials and processes and a passive alignment technique (meaning that the optical elements to not have to be energized during fabrication). Packaging material 54 protects microlens array 10 and provides accurate spacing from lens to optical elements.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method comprising:
   (a) attaching a lens array to a substrate with lenses of the lens array situated opposite the substrate;

(b) surrounding a periphery of the lens array with a packaging material, the packaging material being attached to the substrate;

(c) planarizing the packaging material, the planarized packaging material having a height higher than a height of the lens array; and (d) providing alignment holes through the packaging material, the alignment holes being aligned with respect to positions of the lenses.

2. The method of claim 1 wherein the package substrate comprises a flexible substrate and wherein the packaging material is additionally attached to the lens array.

3. The method of claim 1 wherein (b) comprises providing a dam around the periphery of the lens array and wherein the packaging material comprises the dam.

4. The method of claim 3 wherein the dam comprises a first dam and wherein (b) further comprises (i) providing a second dam around the first darn;

(ii) filling space between the first and second dams with filler material; and (iii) planarizing the first and second dams and the filler material to form the packaging material.

5. The method of claim 4
wherein (b) further comprises, prior to (ii), attaching a stop block to the substrate, and
wherein the first and second dams have thicknesses greater than a thickness of the stop block.

6. The method of claim 1 further comprising (e) cutting the substrate to form a lens package comprising the lens array, a remaining portion of the packaging material, and the alignment holes.

7. The method of claim 6 further comprising (f) mechanically coupling the substrate of the lens package and an optical module by inserting pins through the alignment holes.

8. The method of claim 7 wherein the optical module comprises optical elements selected from the group consisting of, optical fibers, photo emitters, and photo detectors, and combinations thereof, at least some of the optical elements being aligned with respective lenses during (f).

9. The method of claim 7 wherein (f) comprises attaching pins to one of the lens package and the optical module prior to positioning the lens package adjacent the optical module.

10. The method of claim 7 wherein (f) comprises attaching pins to one of the lens package and the optical module after positioning the lens package adjacent the optical module.

11. The method of claim 7 wherein the lens package comprises a first lens package and the optical module comprises a first optical module and wherein (f) comprises mechanically coupling the first lens package, a second lens package, the first optical module, and a second optical module by inserting the pins.

12. The method of claim 11 wherein the first and second optical modules comprise optical elements selected from the group consisting of, optical fibers, photo emitters, and photo detectors, and combinations thereof, at least some of the optical elements being aligned with respective lenses during (f).

13. A method comprising:
attaching a lens array to a substrate with lenses of the lens array situated opposite the substrate;
surrounding a periphery of the lens array with a first dam, the first dam being attached to the substrate and to the lens array;
providing a second dam around the first dam;
filling space between the first and second darns with filler material;
planarizing the first dam, the second dam, and the filler material to form packaging material having a height higher than a height of the lens array;
providing alignment holes through the packaging material, the alignment holes being aligned with respect to positions of the lenses;
cutting the substrate to form a lens package comprising the lens array and a remaining portion of the packaging material; and
mechanically coupling the substrate of the lens package and an optical module by inserting pins through the alignment holes, wherein the optical module comprises optical elements selected from the group consisting of, optical fibers, photo emitters, and photo detectors, and combinations thereof, at least some of the optical elements being aligned with respective lenses of the lenses.

14. The method of claim 13 further comprising, prior to filling, attaching a stop block to the substrate, and wherein the first and second dams have thicknesses greater than a thickness of the stop block.

15. The method of claim 13 wherein mechanically coupling comprises attaching pins to one of the lens package and the optical module prior to positioning the lens package adjacent the optical module.

16. The method of claim 13 wherein mechanically coupling comprises attaching pins to one of the lens package and the optical module after positioning the lens package adjacent the optical module.

17. The method of claim 13 wherein the lens package comprises a first lens package and the optical module comprises a first optical module and wherein mechanically coupling comprises mechanically coupling the first lens package, a second lens package, the first optical module, and a second optical module by inserting the pins.

18. The method of claim 17 wherein at least one of the optical elements is situated at a distance of approximately one focal length from a respective lens.

19. A structure comprising:
a substantially transparent package substrate;
a lens array attached to the substrate with lenses of the lens array situated opposite the substrate; and
packaging material surrounding at least the periphery of the lens array, the packaging material including at least two alignment holes aligned with respect to positions of the lenses.

20. The structure of claim 19 wherein the package substrate comprises a flexible substrate and wherein the packaging material is additionally attached to the lens array.

21. The structure of claim 19 wherein the packaging material comprises a dam.

22. The structure of claim 21 further comprising filler material surrounding the dam, wherein the packaging material comprises the dam and the filler material.

23. The structure of claim 19 wherein a lens package comprises the package substrate, the lens array, and the packaging material, and further comprising an optical module mechanically coupled to the lens package by pins in the alignment holes.

24. The structure of claim 23 wherein the optical module comprises optical elements selected from the group consisting of, optical fibers, photo emitters, and photo detectors, and combinations thereof, at least some of the optical elements being aligned with respective lenses during of the lens package.

25. The structure of claim 24 wherein at least one of the optical elements is situated at a distance of approximately one focal length from a respective lens.

26. The structure of claim 23 wherein the lens package comprises a first lens package and the optical module comprises a first optical module and further comprising a second lens package and a second optical module, the pins coupling the first lens package, the second lens package, the first optical module, and the second optical module in an orientation with the lenses of the first lens package facing the lenses of the second lens package.

27. The structure of claim 26 wherein the first optical module comprises optical elements selected from the group consisting of, optical fibers, photo emitters, and photo detectors, and combinations thereof, at least some of the optical elements being aligned with respective lenses.

28. A structure comprising:
  a substantially transparent package substrate;
  a lens array attached to the substrate with lenses of the lens array situated opposite the substrate;
  packaging material surrounding at least the periphery of the lens array, the packaging material including at least two alignment holes aligned with respect to positions of the lenses and having a height higher than a height of the lens array, the package substrate, the lens array, and the packaging material forming a lens package;
  an optical module mechanically coupled to the lens package by pins in the alignment holes, the optical module comprising optical elements, at least some of the optical elements being aligned with respective lenses during of the lens package and situated at a distance of approximately one focal length from a respective lens.

29. The structure of claim 28 wherein the optical elements are selected from the group consisting of, optical fibers, photo emitters, and photo detectors, and combinations thereof.

30. The structure of claim 29 wherein the lens package comprises a first lens package and the optical module comprises a first optical module and further comprising a second lens package and a second optical module, the pins coupling the first lens package, the second lens package, the first optical module, and the second optical module in an orientation with the lenses of the first lens package facing the lenses of the second lens package.

* * * * *